US008335109B2

(12) United States Patent
Seol et al.

(10) Patent No.: US 8,335,109 B2
(45) Date of Patent: Dec. 18, 2012

(54) NONVOLATILE MEMORY DEVICE AND METHOD FOR OPERATING THE SAME

(75) Inventors: Kwang-Soo Seol, Yongin-si (KR); Yoondong Park, Yongin-si (KR); Sukpil Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 212 days.

(21) Appl. No.: 12/654,712

(22) Filed: Dec. 30, 2009

(65) Prior Publication Data

US 2010/0172182 A1    Jul. 8, 2010

(30) Foreign Application Priority Data

Jan. 6, 2009   (KR) .................. 10-2009-0000850

(51) Int. Cl.
*G11C 16/04* (2006.01)
(52) U.S. Cl. ............................... 365/185.17; 365/185.05
(58) Field of Classification Search .................. None
See application file for complete search history.

(56) References Cited

U.S. PATENT DOCUMENTS

| | | | | |
|---|---|---|---|---|
| 2004/0125629 A1* | 7/2004 | Scheuerlein et al. | ........... | 365/17 |
| 2006/0146608 A1* | 7/2006 | Fasoli et al. | ............. | 365/185.17 |
| 2007/0102749 A1* | 5/2007 | Shirota et al. | ................ | 257/314 |
| 2008/0285350 A1* | 11/2008 | Yeh | ........................... | 365/185.17 |
| 2010/0002516 A1 | 1/2010 | Sim et al. | | |

FOREIGN PATENT DOCUMENTS

| | | |
|---|---|---|
| JP | 2007-266143 | 10/2007 |
| KR | 10-2006-0089547 | 8/2006 |
| KR | 10-0707217 | 4/2007 |
| KR | 10-2008-0012667 | 2/2008 |

* cited by examiner

*Primary Examiner* — Hoai V Ho
*Assistant Examiner* — James G Norman
(74) *Attorney, Agent, or Firm* — Harness, Dickey & Pierce, P.L.C.

(57) ABSTRACT

Disclosed is a nonvolatile memory device which includes a plurality of cell array layers stacked on a semiconductor substrate. Each of the plurality of cell array layers includes a plurality of strings. Each of the plurality of strings has string and ground select transistors and a plurality of memory cells connected in series between the string and ground select transistors. A common source line is on each of the plurality of cell array layers. Each common source line is connected with first sides of the plurality of strings on a corresponding cell array layer. A plurality of bit lines is connected with second sides of the plurality of strings disposed on the cell array layers and arranged in the vertical direction to the semiconductor substrate. A plurality of word lines is connected with the plurality of memory cells.

20 Claims, 18 Drawing Sheets

Fig. 8A

| | BL0-BL2 | SSL | WL0-WL31 | GSL0 | CSL0-CSL2 | Vch |
|---|---|---|---|---|---|---|
| Unsel Layer | 0 | 0 | Vpass | Vcc | Vcc | Boosted |
| Sel Layer | 0 | 0 | Vpass | Vcc | 0 | 0 |

Fig. 9A

| | | BL0-BL2 | SSL | WL0-WL31 | GSL0 | CSL0-CSL2 | Vch |
|---|---|---|---|---|---|---|---|
| Sel Layer | Sel BL | Floating | Vcc | Vpass | 0 | 0 | 0 |
| | Unsel BL | Vcc | Vcc | Vpass | 0 | 0 | Boosted |
| Unsel Layer | Sel BL | Floating | Vcc | Vpass | 0 | Vcc | Boosted |
| | Unsel BL | Vcc | Vcc | Vpass | 0 | Vcc | Boosted |

Fig. 10A

| | | SSL | WL0–WL31 | | | GSL0 | CSL0–CSL2 | Vch |
|---|---|---|---|---|---|---|---|---|
| | BL0–BL2 | | Sel WLn | Unsel WLn+1, WLn−1 | Unsel WL0–WLn−2 WLn+2–WL31 | | | |
| Sel Layer | Sel BL | Floating | Vcc | Vpgm | 0 | Vpass | 0 | Vcc | – |
| | Unsel BL | Vcc | Vcc | Vpgm | 0 | Vpass | 0 | Vcc | Boosted |
| Unsel Layer | Sel BL | Floating | Vcc | Vpgm | 0 | Vpass | 0 | Vcc | Boosted |
| | Unsel BL | Vcc | Vcc | Vpgm | 0 | Vpass | 0 | Vcc | Boosted |

Fig. 11A

| | | BL0-BL2 | SSL | WL0-WL31 | | GSL0 | CSL0-CSL2 |
|---|---|---|---|---|---|---|---|
| | | | | Sel | Unsel | | |
| Sel Layer | Sel BL | Vcc | Vread | Vref | Vread | Vread | 0 |
| | Unsel BL | Vcc | Vread | Vref | Vread | Vread | 0 |
| Unsel Layer | Sel BL | Vcc | Vread | Vref | Vread | Vread | Floating |
| | Unsel BL | Vcc | Vread | Vref | Vread | Vread | Floating | ized
NONVOLATILE MEMORY DEVICE AND METHOD FOR OPERATING THE SAME

CROSS-REFERENCE TO RELATED APPLICATIONS

This U.S. non-provisional patent application claims priority under 35 U.S.C §119 to Korean Patent Application No. 10-2009-0000850, filed on Jan. 6, 2009, the entire contents of which are herein incorporated by reference.

BACKGROUND

Example embodiments relate to a large-capacity and high-density nonvolatile memory device having a three-dimensional structure and an operating method thereof.

In general, a conventional nonvolatile memory device may be a device which is configured to electrically erase, program and retain data, even at power-off. For this reason, the nonvolatile memory device has been applied to various applications.

Nonvolatile memory devices may be classified into a NAND-type and a NOR-type based on a cell array structure. A NAND-type nonvolatile memory device has a high density, while the NOR-type nonvolatile memory device has a high speed.

In particular, the NAND-type nonvolatile memory device has a high density because the NAND-type nonvolatile memory device includes a cell string structure where a plurality of memory cell transistors is connected in series. Since the NAND-type nonvolatile memory device changes information stored in a plurality of memory cell transistors at the same time, the update speed of the NAND-type nonvolatile memory device may be remarkably rapid as compared with the NOR-type nonvolatile memory device. The NAND-type nonvolatile memory device is applied to portable electronic products having a mass storage device, such as a digital camera, an MP3 player, and the like.

Research has been done to improve the benefits of the NAND-type nonvolatile memory device. As a result of the research, a three-dimensional NAND-type nonvolatile memory device has been proposed.

SUMMARY

Example embodiments provide a three-dimensional NAND-type nonvolatile memory device capable of independently programming layers of memory cells and improving a degree of integration.

Other example embodiments provide an operating method of a three-dimensional NAND-type nonvolatile memory device capable of programming layers of memory cells independently.

At least one example embodiment provides a nonvolatile memory device including a plurality of cell array layers stacked on a semiconductor substrate, a plurality of bit lines and a plurality of word lines. Each of the plurality of cell array layers includes a plurality of strings and a common source line connected to first sides of the plurality of strings. Each of the plurality of strings has a plurality of memory cells connected between string and ground select transistors. Each of the plurality of bit lines is connected to a second side of one of the plurality of strings for each of the plurality of cell array layers.

BRIEF DESCRIPTION OF THE DRAWINGS

Non-limiting and non-exhaustive example embodiments will be more clearly understood from the following detailed description in conjunction with the accompanying drawings, in which:

FIGS. 8A, 9A, 10A, and 11A are tables showing bias conditions during the program operation of FIG. 6;

DETAILED DESCRIPTION

Figure 1:
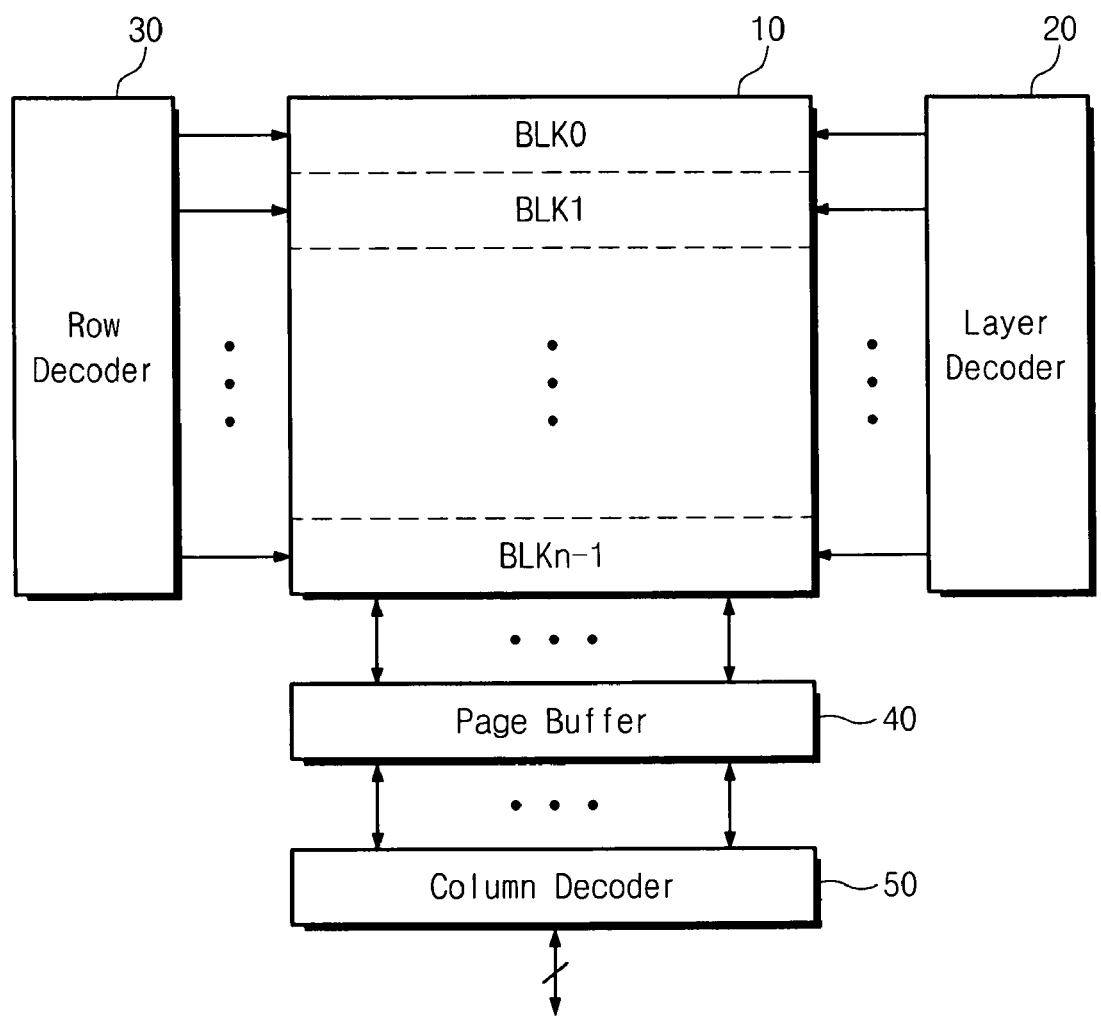
FIG. 1 is a block diagram of a nonvolatile memory device according to an example embodiment.

Example embodiments will now be described more fully with reference to the accompanying drawings. Many alternate forms may be embodied and example embodiments should not be construed as limited to example embodiments set forth herein. In the drawings, the thicknesses of layers and regions may be exaggerated for clarity, and like reference numerals refer to like elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein to describe one element or a relationship between a feature and another element or feature as illustrated in the figures. It will be understood that spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

It should also be noted that in some alternative implementations, the functions/operations noted may occur out of the order noted in the figures. For example, two figures shown in succession may in fact be executed substantially concurrently, or may sometimes be executed in reverse order, depending upon the functions/operations involved.

FIG. 1 is a block diagram of a nonvolatile memory device according to an example embodiment.

Referring to FIG. 1, a NAND-type nonvolatile memory device may include a memory cell array 10, a layer decoder 20, a row decoder 30, a page buffer 40, and a column decoder 50.

While only one cell array layer of the memory cell array 10 is illustrated, the memory cell array 10 may include a plurality of cell array layers. The cell array layer, as shown, may include a plurality of memory blocks BLK0-BLKn-1. It should be understood that each cell array layer includes a plurality of memory blocks. Each of the memory blocks BLK0-BLKn-1 may include a plurality of word lines, a plurality of bit lines, and a plurality of memory cells. Each of the memory blocks BLK0-BLKn-1 stores data. The memory cell array 10 will be more fully described with reference to FIGS. 2 to 5.

The layer decoder 20 may be configured to select one of the cell array layers in the memory cell array 10 based on address information.

The row decoder 30 selects one of the memory blocks BLK0-BLKn-1 of the selected cell array layer based on the address information. Furthermore, the row decoder 30 selects word lines of the selected memory block.

The page buffer 40 may be configured to temporarily store data to be written in selected memory cells or sense data stored in selected memory cells, based on a mode of operation. The page buffer 40 may act as a write driver circuit during a program mode of operation and as a sense amplifier circuit during a read mode of operation. Although not shown in the figures, the page buffer 40 may include page buffers which are connected to bit lines or bit line pairs, respectively.

The column decoder 50 may provide a data transfer path between the page buffer 40 and an external device (for example, a memory controller).

Figure 2:
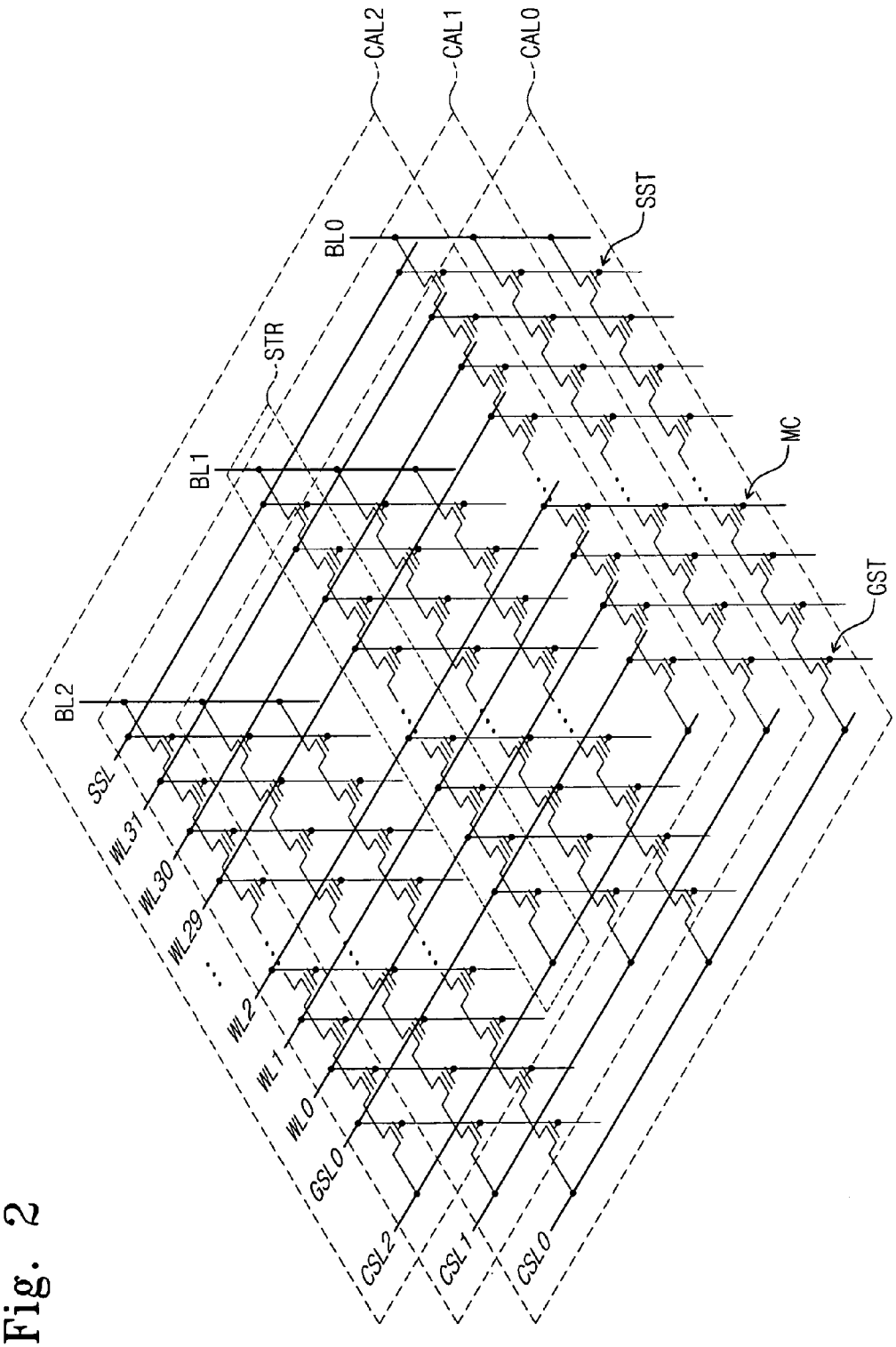
FIG. 2 is a circuit diagram of a memory cell array of a nonvolatile memory device according to an example embodiment.

FIG. 2 is a circuit diagram of a memory cell array of a nonvolatile memory device according to an example embodiment of the present invention. The memory cell array illustrated in FIG. 2 may be the memory cell array 10.

Referring to FIG. 2, the memory cell array may have L layers (L being an integer of two or more) that are stacked and each cell array layer may have memory cells arranged two-dimensionally. In FIG. 2, L equals three, that is, the nonvolatile memory device may include a plurality of cell array layers CAL0-CAL2, which are stacked. Thus, memory cells MC are arranged three-dimensionally. However, it should be understood that more or less cell array layers may be stacked to increase or decrease a memory capacity of the nonvolatile memory device.

The cell array layers CAL0-CAL2 may have the same circuit structure as one another. Each of the cell array layers CAL0-CAL2 may include M strings STR (M being an integer of 1 or more) connected in common with a common source line. As shown in FIG. 2, M equals three. For example, the cell array layer CAL0 may include three strings STR connected in common with a common source line CSL0, the cell array layer CAL1 may include three strings STR connected in common with a common source line CSL1, and the cell array layer CAL2 may include three strings STR connected in common with a common source line CSL2. The common source lines CSL0, CSL1, and CSL2 may be used as selection lines for selecting the cell array layers CAL0-CAL2, respectively, during an operation of the nonvolatile memory device, respectively.

For the sake of clarity and brevity, the memory cell array will be described with reference to one string STR in a cell array layer (for example, CAL0) connected with a bit line (for example, BL0). The string STR may include a string select transistor SST, a ground select transistor GST, and N memory cells MC (N being an integer of 1 or more) connected in series between the select transistors SST and GST. Each of the memory cells MC may be a transistor. A drain of the string select transistor SST is connected with a corresponding bit line BL0, and a source of the ground select transistor GST is connected with a corresponding common source line CSL0. The string select transistors SST in the cell array layers CAL0-CAL2 are connected in common with a string select line SSL, and the ground select transistors GST in the cell array layers CAL0-CAL2 are connected in common with a ground select line GSL0. The memory cells MC of each of strings STR are connected with word lines WL0-WL31, respectively.

The bit lines BL0-BL2 are connected with the strings STR, respectively. That is, the bit lines BL0-BL2 are extended vertically with respect to a semiconductor substrate so as to be connected to drains of the string select transistors SST.

Furthermore, the word lines WL0-WL31, the string select line SSL, and the ground select line GSL0 are arranged to penetrate the stacked cell array layers CAL0-CAL2. That is, the word lines WL0-WL31 are connected in common with the memory cells MC in each of the cell array layers CAL0-CAL2. The string select line SSL is connected in common with string select transistors SST in the each of the cell array layers CAL0-CAL2. The ground select line GSL0 is connected in common with ground select transistors GST in the each of the cell array layers CAL0-CAL2.

Figure 3:
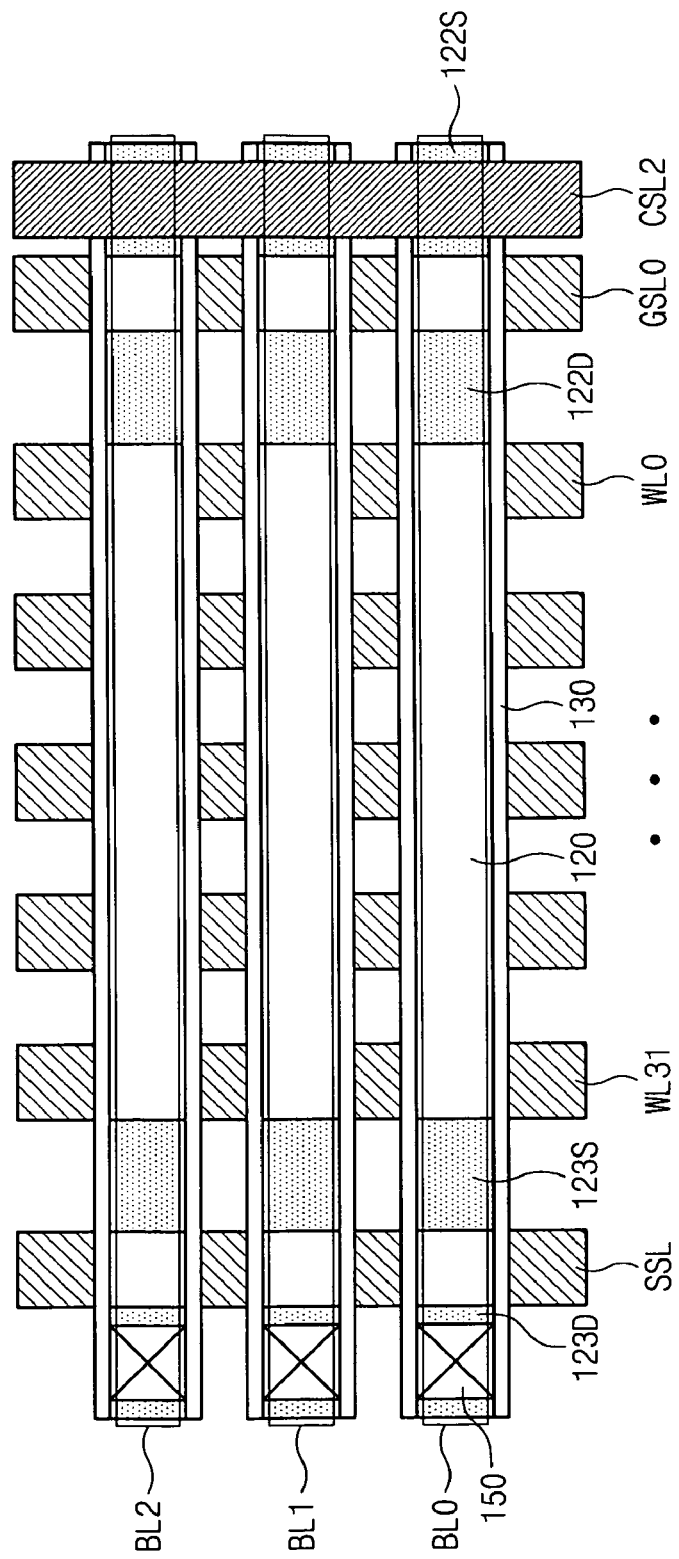
FIG. 3 is a top view of the memory cell array shown in FIG. 2.
Figure 4:
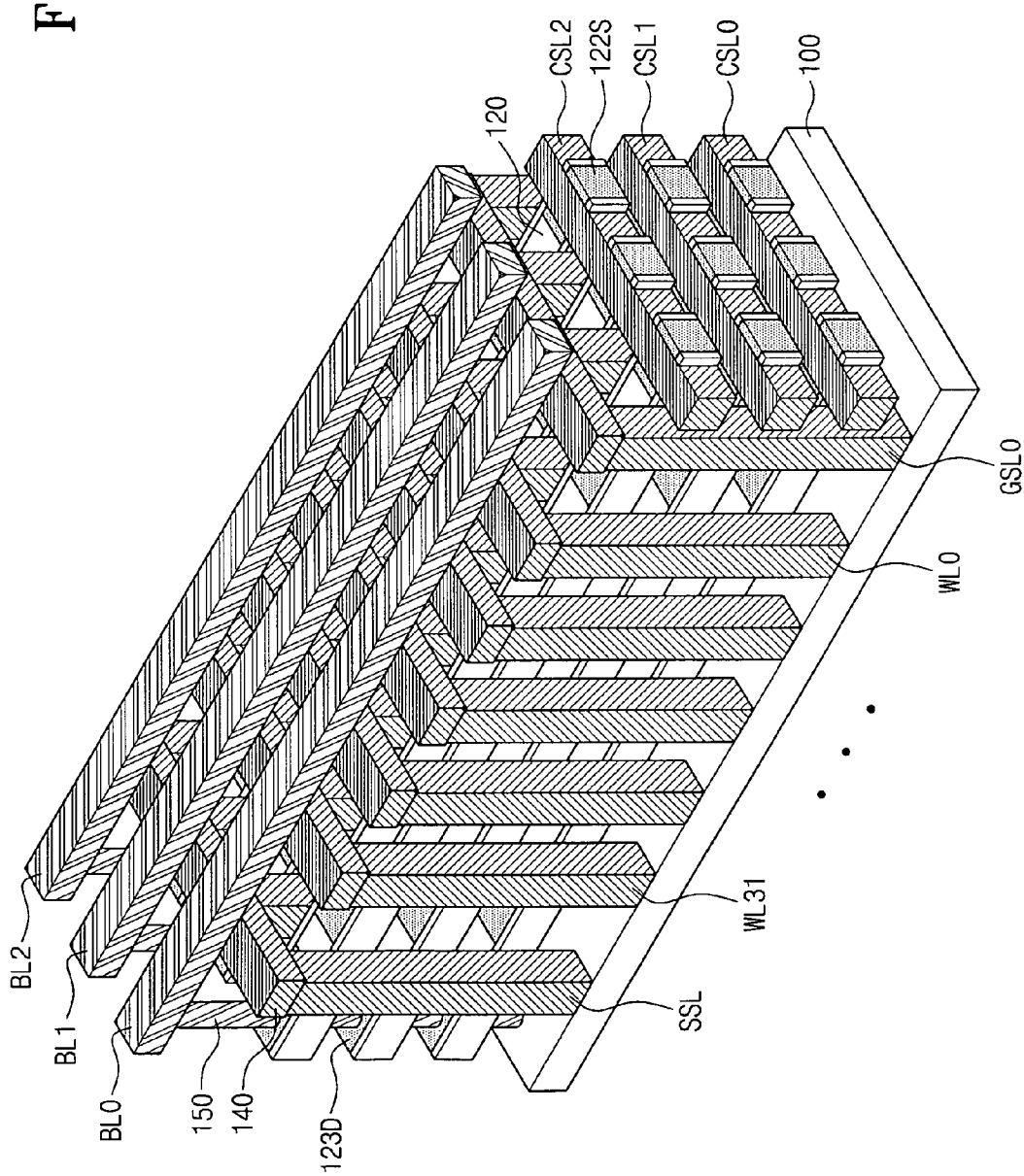
FIG. 4 is a perspective view seen in a first direction of the memory cell array shown in FIG. 2.
Figure 5:
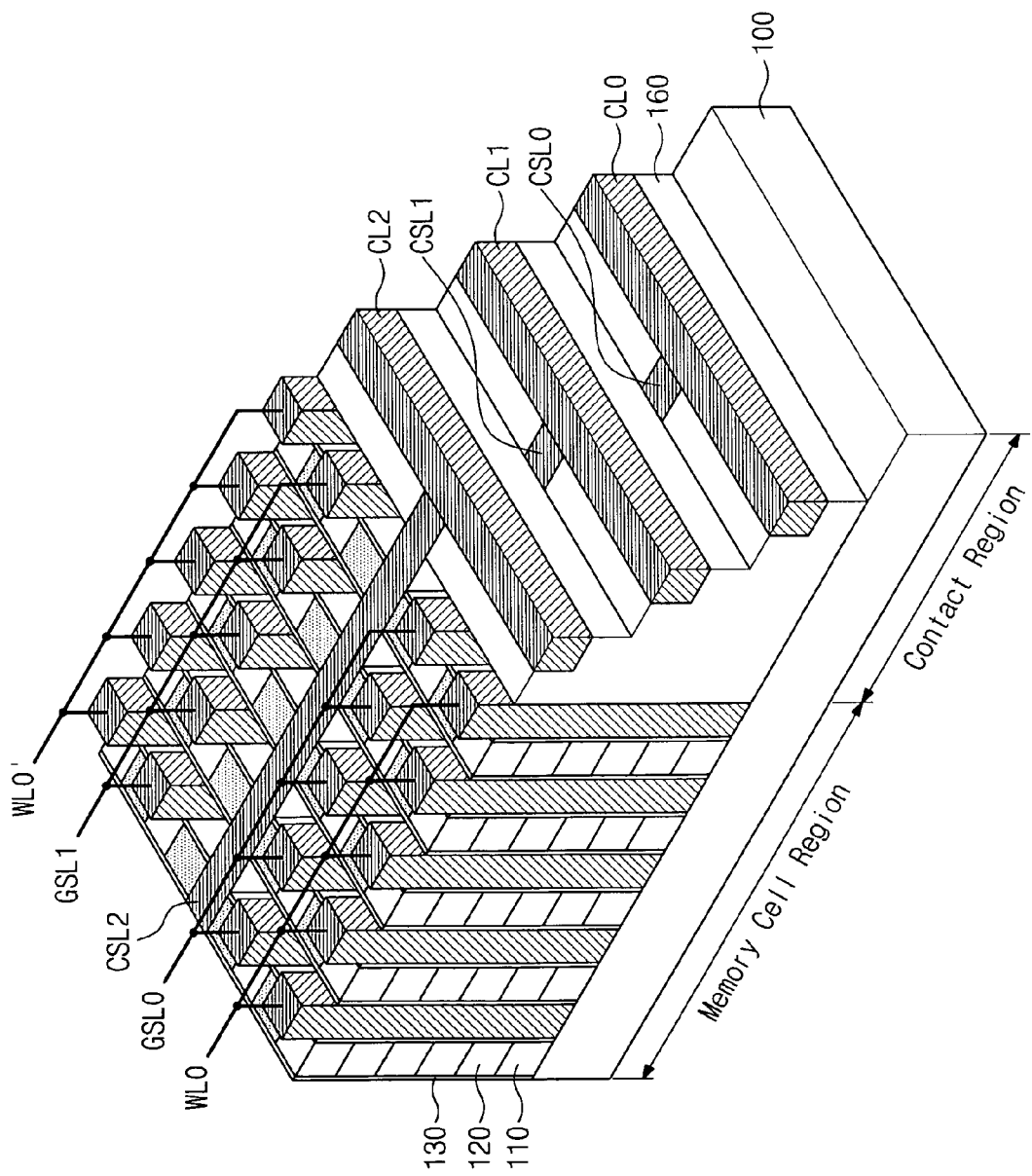
FIG. 5 is a perspective view of an example embodiment of a memory cell array of a nonvolatile memory device including the memory cell array shown in FIG. 2.

FIG. 3 is a top view of the memory cell array shown in FIG. 2. FIG. 4 is a perspective view of the memory cell array shown in FIG. 2. FIG. 5 is a perspective view of an example embodiment of a memory cell array including the memory cell array shown in FIG. 2.

Referring to FIGS. 3 to 5, a semiconductor substrate 100 may include a memory cell region and a contact region. Semiconductor layer patterns 120 having a line shape are arranged three-dimensionally on the memory cell region of the semiconductor substrate 100. The semiconductor layer patterns 120 are stacked in a vertical direction on the semiconductor substrate 100. The number of stacked semiconductor layer patterns 120 may differ according to a capacity of the nonvolatile memory device. Insulation film patterns 110 are interposed between the semiconductor layer patterns 120 and the semiconductor substrate 100. The semiconductor layer patterns 120 are formed by stacking a semiconductor layer and an insulation layer in turn to form a stack structure and patterning the stack structure in a line shape. Semiconductor layer patterns 120 arranged on the same layer may constitute one cell array layer. Semiconductor layer patterns 120 are used as channel regions of the memory cells MC, respectively. The line-type semiconductor layer patterns 120 may be formed of a poly-crystal or single-crystal semiconductor. N-type or p-type impurities may be doped in the semiconductor layer patterns 120.

Charge storing films 130 are formed on sides of the stacked semiconductor layer patterns 120. In particular, each of the charge storing films 130 may include a charge tunneling film, a charge trap film, and a charge blocking film. The charge storing films 130 may be formed to be cover one side or both sides of each of the stacked semiconductor layer patterns 120.

While only word line WL0 is shown in FIGS. 3 and 4, each of the word lines WL0-WL31 (e.g., gate electrodes) is arranged between stacks of semiconductor layer patterns 120 in a horizontal direction of the semiconductor substrate 100. The word lines WL0-WL31 may have a pillar shape and be extend in a vertical direction with respect to the semiconductor substrate 100. As a result, the word lines WL0-WL31 may be formed to intersect side walls of the stacked line-type semiconductor layer patterns 120.

Since a plurality of gate electrodes (WL0-WL31) is arranged on side walls of the line-type semiconductor layer patterns 120, channels of the memory cells MC may be formed in a parallel/horizontal direction with the semiconductor substrate 100. In other words, each of the strings STR may include memory cells MC that are connected in series to form a horizontal channel.

Namely, one cell string may be formed by disposing a string select line SSL, a plurality of word lines WL0-WL31, and a ground select line GSL0 on a side wall of each semiconductor layer pattern 120. This means that a side wall of each semiconductor layer pattern 120 is used as a channel region. The select line SSL, word lines WL0-WL31 and ground select line GSL0 may be spaced apart from one another such that channel regions of memory cells are overlapped. Source and drain regions 122S and 122D are formed on one end of a semiconductor layer pattern 120 adjacent to the ground select line GSL0. Source and drain regions 123S and 123D are formed on the other end of the semiconductor layer pattern 120 adjacent to the string select line SSL. The string select line SSL, ground select GSL0, and word lines WL0-WL31 intersecting different semiconductor layer patterns 120 may be electrically interconnected via an interconnection lines 140, which are disposed over the stacked line-type semiconductor layer patterns 120. The interconnection lines 140 may be normal to the semiconductor layer patterns 120.

In semiconductor layer patterns 120, the source regions 122S for each cell array layer CAL0-CAL2 may be electrically connected via a corresponding common source line CSL0-CSL2. For example, in the case of the semiconductor layer patterns 120 on the cell array layer CAL0, the source regions 122S on the cell array layer CAL0 may be electrically connected via the common source line CSL0. The common source lines CSL0-CSL2 may be isolated from one another and formed on the cell array layers CAL0-CAL2, respectively, so as to intersect semiconductor layer patterns 120 on the respective cell array layer CAL0-CAL2. For example, the common source line CSL0 is formed on the cell array layer CAL0 so as to intersect semiconductor layer patterns 120 on the cell array layer CAL0. The common source line CSL1 is formed on the cell array layer CAL1 so as to intersect semiconductor layer patterns 120 on the cell array layer CAL1. The common source line CSL2 is formed on the cell array layer CAL2 so as to intersect semiconductor layer patterns 120 on the cell array layer CAL2.

In the example embodiment illustrated in FIG. 5, cell strings may be arranged on both sides of the common source lines CSL0-CSL2. This means that at least two memory cell arrays are formed on one cell array layer. For example, as illustrated in FIG. 5, a cell array may include one memory cell array layer having cell strings connected to the column source line CSL2 via a ground select line GSL0 (e.g., the cell array layer CAL2 shown in FIGS. 3 and 4) and another memory cell array having cell strings (including memory cells coupled to a word line WL0') connected to the column source line CSL2 via a ground select line GSL1. Remaining cell array layers may be configured in the same manner as described above. Further, it should be understood that common source lines CSL0-CSL2 are formed the cell array layers, respectively, to form two or more cell array layers. As illustrated in FIG. 5, connection lines CL0-CL2 are formed at the contact region of the semiconductor substrate 100 to be connected to the common source lines CSL0-CSL2 of the cell array layers CAL0-CAL2. The connection lines CL0-CL2 are formed on the cell array layers CAL0-CAL2, respectively. The memory cell array illustrated in FIG. 5 may be the memory cell array 10, illustrated in FIG. 1.

The connection lines CL0-CL2 may have a stepwise stacked structure for electrical connection with corresponding contacts (not shown). In other words, an insulation film 160 may be formed on the contact region to have a step shape, and the connection lines CL0-CL2 may be disposed on the insulation film 160.

As shown in FIG. 4, bit line contact plugs 150 of the bit lines BL0-BL2 are formed at one side of the string select line SSL to penetrate the semiconductor layer patterns 120. Each bit line contact plug 150 may connect stacked drain regions 123D. Portions of the bit lines BL0-BL2 (conductive lines) extend in the same direction as the semiconductor layer patterns 120.

In the event that string select transistors SST are formed of an NMOS transistor, the bit line contact plugs 150 may be formed of a semiconductor material doped with a p-type impurity. Therefore, a PN junction may be formed between a bit line contact plug 150 and a drain region 123D of a string select transistor SST. As the PN junction is formed between the bit line contact plug 150 and the drain region 123D of the string select transistor SST, it is possible to prevent electrical errors among the cell array layers CAL0-CAL2 during an operation of the nonvolatile memory device. This will be more fully described below with reference to FIG. 6 to FIG. 11B.

A program method of a nonvolatile memory device according to an example embodiment will be more fully described with reference to FIG. 6 to FIG. 11B. The program method of the nonvolatile memory device illustrated in FIGS. 6-11B utilizes a self-boosting manner and a local self-boosting manner to prevent unselected cells from being programmed. The program method may be implemented using the nonvolatile memory device illustrated in FIG. 1. For the sake of clarity and brevity, the program method of FIGS. 6-11B is described with reference to the memory cell array illustrated in FIG. 2. However, it should be understood that the program method of FIGS. 6-11B may be implemented using the memory cell array illustrated in FIG. 5.

Figure 6:
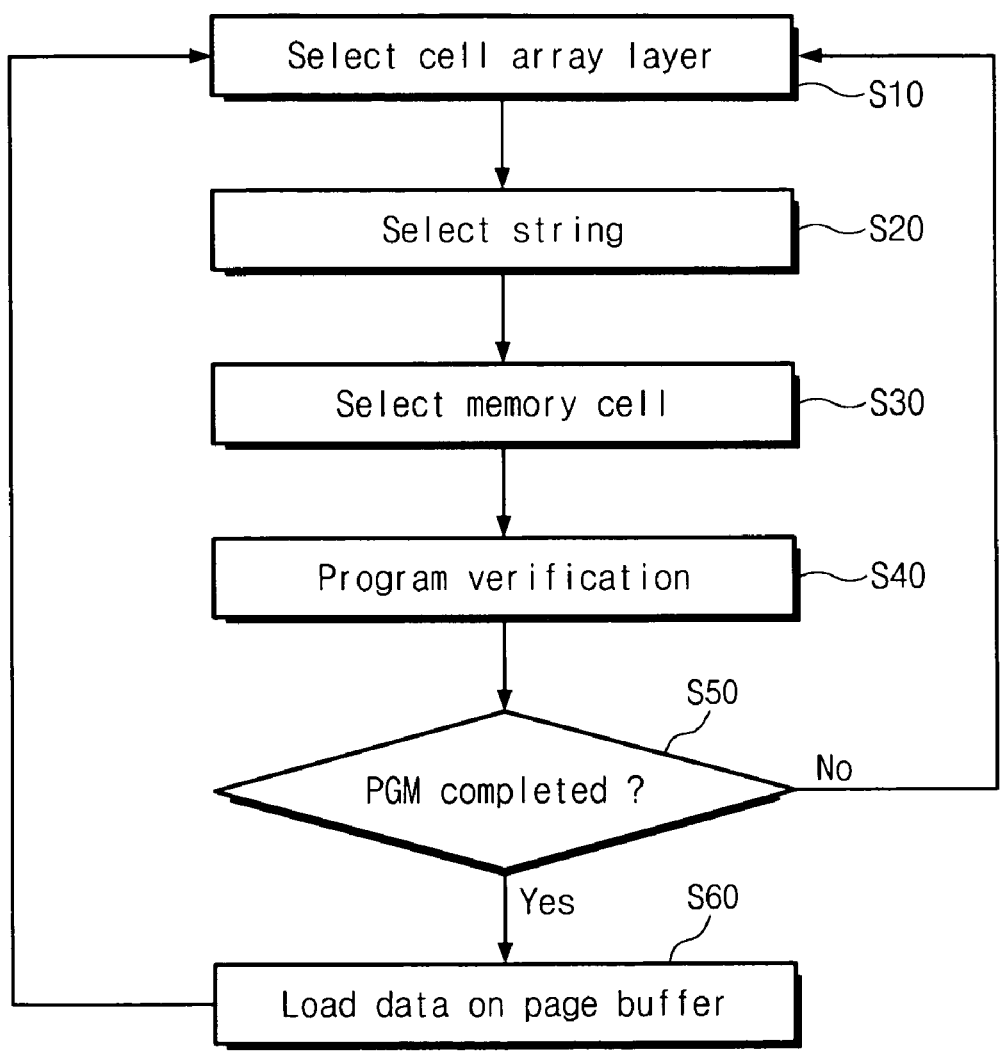
FIG. 6 is a flow chart illustrating a program operation of a nonvolatile memory device according to an example embodiment.
Figure 7:
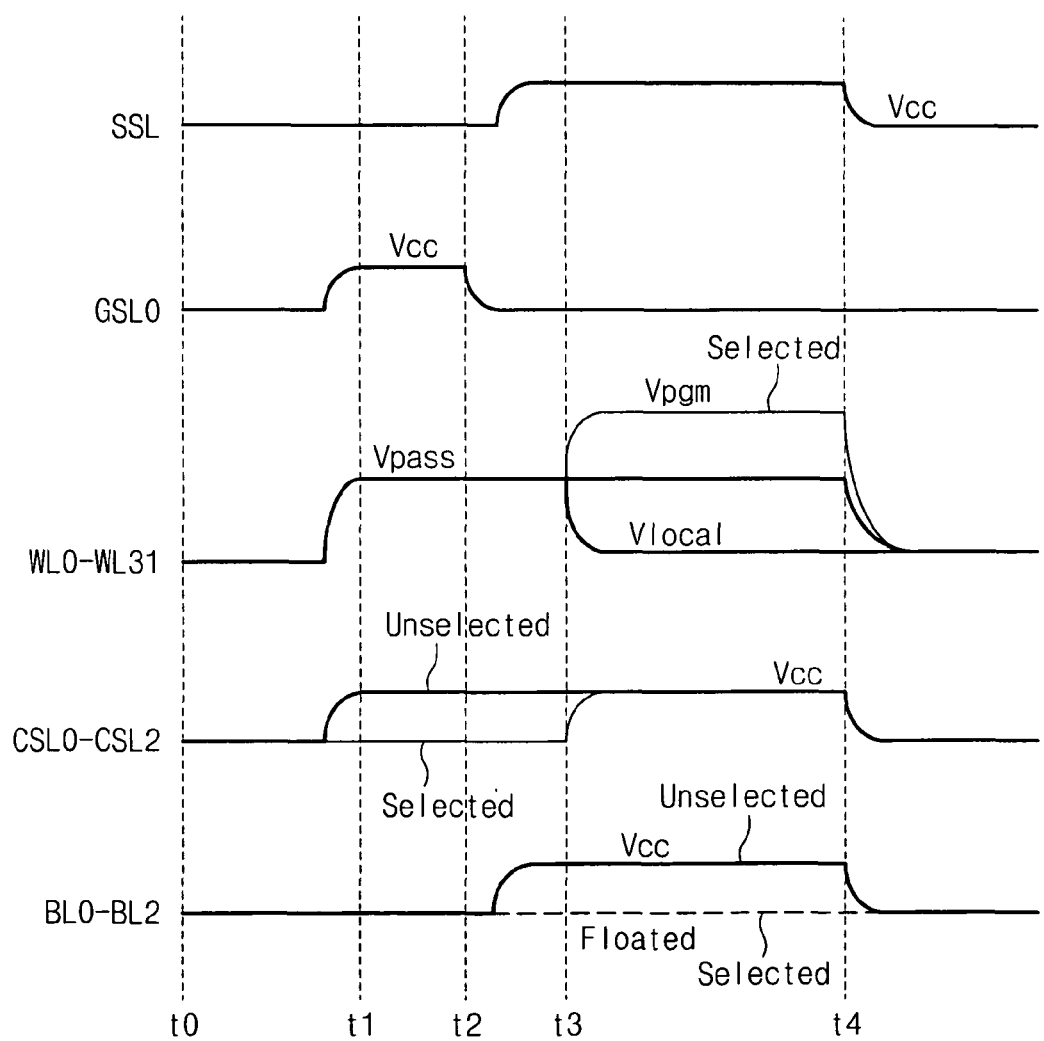
FIG. 7 is a timing diagram showing a bias condition during the program operation of FIG. 6.
Figure 8B:
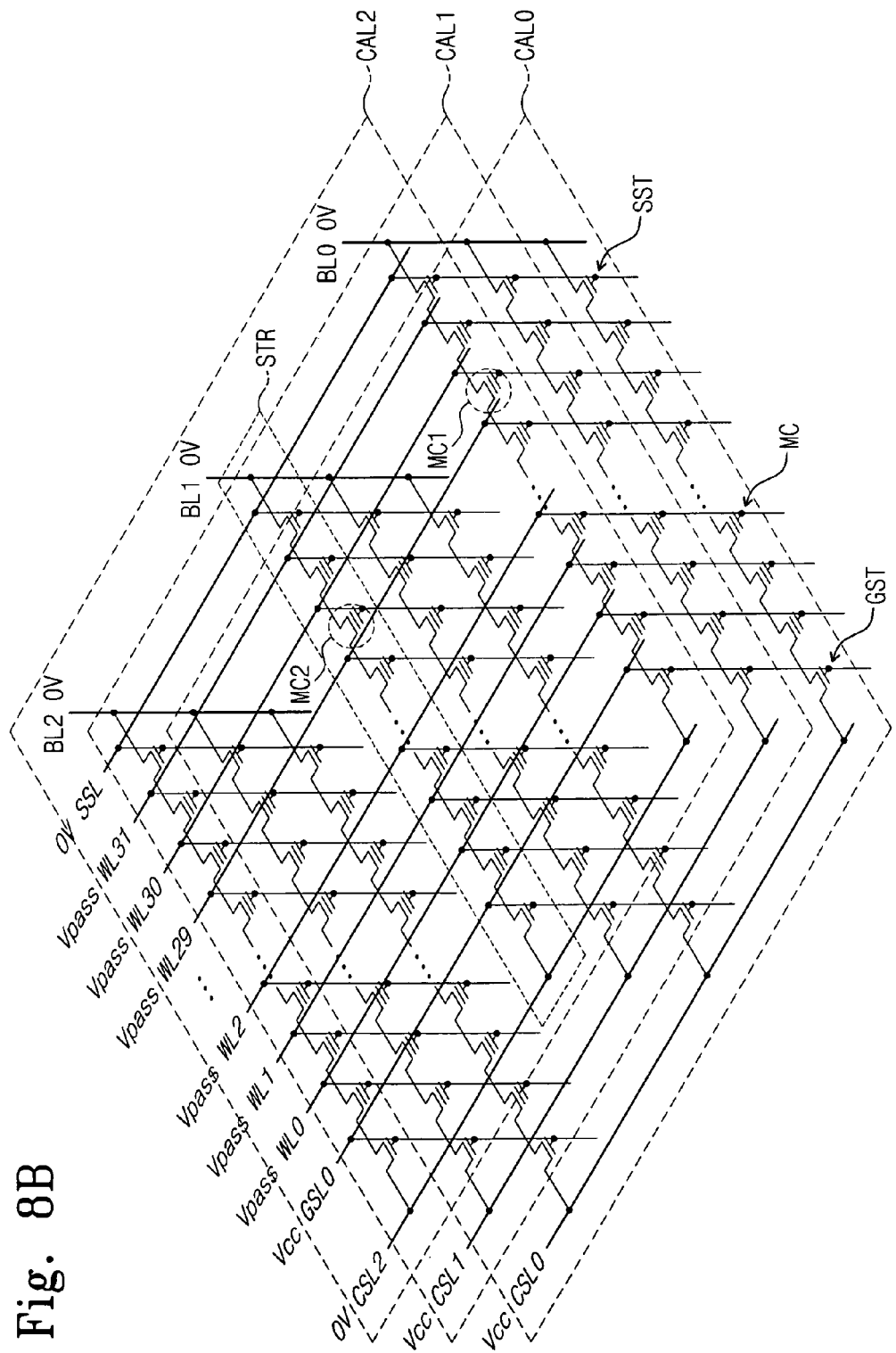
FIGS. 8B, 9B, 10B, and 11B are circuit diagrams showing bias conditions during the program operation of FIG. 6.
Figure 9B:
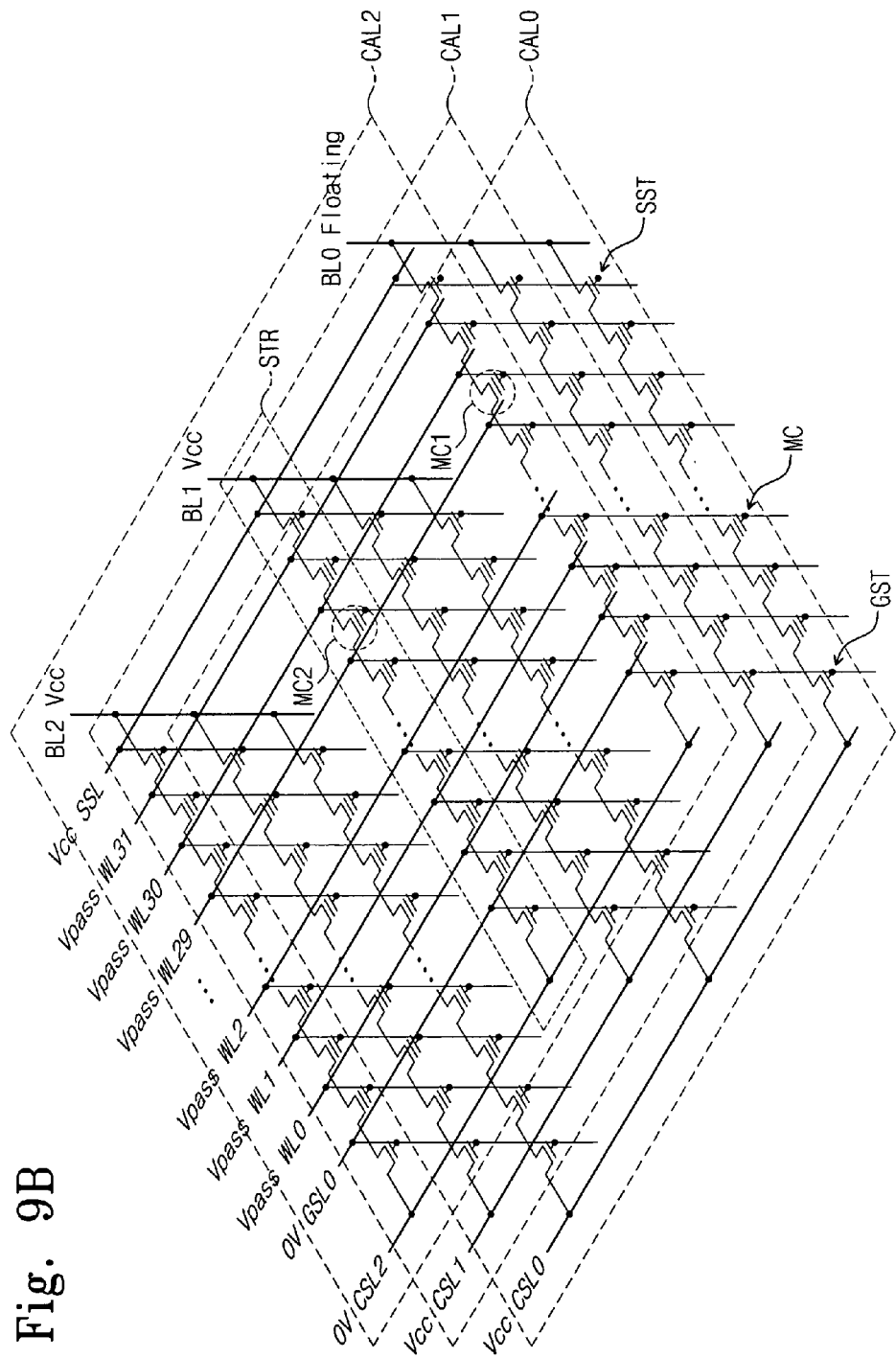
Figure 10B:
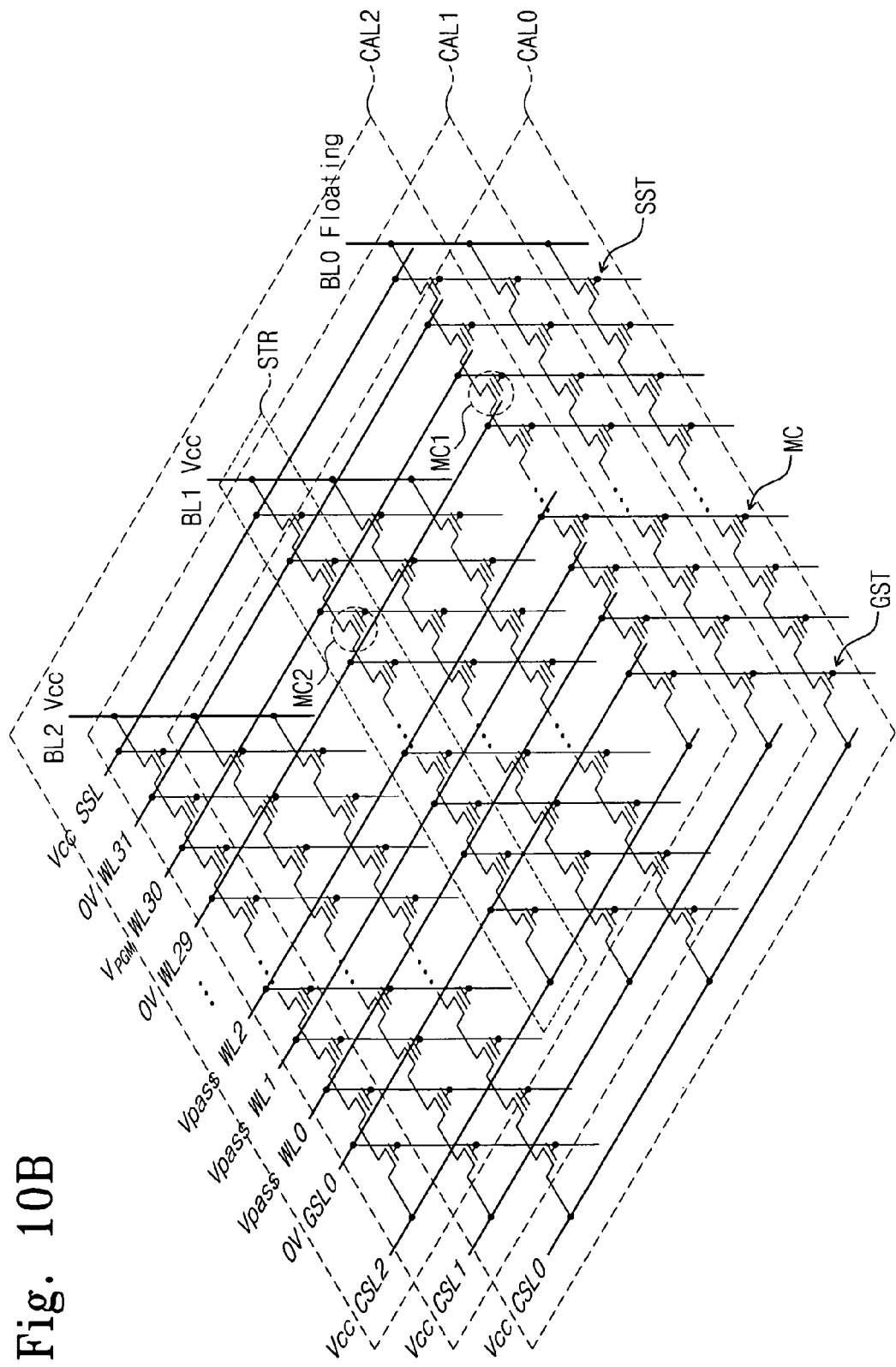

FIG. 6 is a flow chart for describing a program operation of a nonvolatile memory device according to an example embodiment. FIG. 7 is a timing diagram showing a bias condition during the program operation of the nonvolatile memory device according to an example embodiment. FIGS. 8A, 9A, 10A, and 11A are tables showing bias conditions during the program operation according to an example embodiment. FIGS. 8B, 9B, 10B, and 11B are circuit diagrams showing bias conditions during the program operation according to an example embodiment.

Referring to FIGS. 6, 7, 8A and 8B, at S10, the layer decoder 20 may select one of the cell array layers CAL0-CAL2 in response to address information. For example, the cell array layer CAL2 is selected and cell array layers CAL0 and CAL1 are unselected. However, it should be understood that any of the cell array layers CAL0-CAL2 may be selected. Channels of the unselected cell array layers CAL0 and CAL1 may be boosted when the cell array layer CAL2 is selected. This will be more fully described below.

When a program operation commences, the bit lines BL0-BL2, the common source lines CSL0-CSL2, the string and ground select lines SSL and GSL0, and the word lines WL0-WL31 are set to 0V.

At t1, shown in FIG. 7, the common source line CSL2 of the selected cell array layer CAL2 may be maintained at 0V, while a voltage Vcc is applied to the common source lines CSL0 and CSL1 of the unselected cell array layers CAL0 and CAL1. A pass voltage Vpass is applied to the word lines WL0-WL31, while the lines BL0-BL2 and SSL are maintained at 0V. A voltage Vcc is supplied to the ground select line GSL0. The pass voltage Vpass may be a voltage that is enough to turn on at least one of the memory cells MC.

As the pass voltage Vpass is supplied to the word lines WL0-WL31, the memory cells MC are turned on. Thus, the channels of the memory cells MC become connected to one another. Since the ground select line GSL0 is supplied with the voltage Vcc, ground select transistors GST are turned on. This enables a voltage of 0V to be transferred to the channels of the memory cells MC of the selected cell array layer CAL2. On the other hand, since the channels of the memory cells MC of the unselected cell array layers CAL0 and CAL1 are charged up to a voltage (Vcc-Vth) (Vth being a threshold voltage of a ground select transistor GST), the channels of the memory cells MC of the unselected cell array layers CAL0 and CAL1 may be boosted up to a voltage of γVpass (γ being a coupling ratio between a gate and a channel), and then drains of the ground select transistors GST may be floated. As a result, channel voltages Vch of strings STR in the selected cell array layer CAL2 may become 0V, and channel voltages Vch of strings STR in the unselected cell array layers CAL0 and CAL1 may be boosted up to a voltage γVpass.

Referring to FIGS. 6, 7, 9A and 9B, at step S20, channels of unselected strings STR on the selected cell array layer CAL2 may be boosted. Selection of the strings STR may be made by selecting the bit lines BL0-BL2. For example, the first bit line BL0 is selected. Thus, the string STR on cell array layer CAL2 and coupled to the bit line BL0 is selected.

At t2, a voltage of 0V is applied to the ground select line GSL0, and a voltage of Vcc is applied to the string select line SSL and the unselected bit lines BL1 and BL2 connected with the unselected strings STR. At this time, the selected bit line BL0 connected with the selected string STR may be supplied with a voltage of 0V or floated. The common source line CSL2 of the selected cell array layer CAL2 may be maintained at 0V, the common source lines CSL0 and CSL1 of the unselected cell array layers CAL0 and CAL1, respectively, may be retained at a voltage of Vcc, and the word lines WL0-WL31 may be maintained at the pass voltage Vpass.

As a voltage of 0V is applied to the ground select line GSL0, the ground select transistors GST are turned off. Since the selected bit line BL0 is floated or 0V, a channel voltage of the selected string STR may be maintained at 0V.

In case of the unselected strings STR on the selected cell array layer CAL2 connected with the unselected bit lines BL1 and BL2, sources of the string select transistors SST of the unselected strings STR may be charged up to a voltage of (Vcc-Vth) and then shut off, since a voltage Vcc is applied to the unselected bit lines BL1 and BL2. Therefore, in the selected cell array layer CAL2, channels of the unselected strings STR become disconnected with the bit lines BL1 and BL2 and the common source line CSL2 and become floated.

In case of the unselected cell array layers CAL0 and CAL1, channel voltages of the strings STR connected with the unselected bit lines BL1 and BL2 may be maintained at the boosted voltage γVpass due to shut-off of corresponding string select transistors SST to the unselected bit lines BL1 and BL2.

When a channel voltage of the selected string STR is maintained at 0V and channels voltages of the other strings STR connected to the bit line BL0 are boosted, the channel voltages of the other strings STR may be varied since drain regions of the other strings STR are electrically connected with the corresponding bit line BL0. For example, since the channel voltage of the selected string STR on the selected cell array layer CAL2 is set to 0V and channel voltages of the unselected strings STR, connected with selected bit line BL0, on unselected cell array layers CAL0 and CAL1 are set to the boosted voltage γVpass, the channel voltages of the unselected strings STR connected with the selected bit line BL0 may be varied. In particular, in a case where a bit line contact plug 150, (refer to FIG. 4) is formed of an n+ poly and the selected bit line BL0 is floated, a channel voltage of the selected string STR may be increased due to boosted channel voltages γVpass of the unselected strings STR connected with the selected bit line BL0. But, as described above, since a bit line contact plug 150 is formed of an n+ poly, the PN junction may be formed between the bit line contact plug 150 and a drain region of a string select transistor SST. Although the selected bit line BL0 is floated under the condition that a channel voltage of the selected string is 0V and channel voltages of the unselected strings STR, connected with selected bit line BL0 on the unselected cell array layers CAL0 and CAL1, are set to the boosted voltage γVpass, the PN junction between the bit line contact plug 150 and drain regions of string select transistors SST may be reversely biased. This means that the selected string STR on the selected cell array layer CAL2 is electrically disconnected from the unselected strings STR on the unselected cell array layers CAL0 and CAL1. Accordingly, it is possible to prevent a channel voltage of a selected string connected with a selected bit line from being increased/varied due to boosted channel voltages of unselected strings connected with the selected bit line.

Referring to FIGS. 6, 7, 10A, and 10B, at S30, a selected memory cell MC1 may be programmed. For example, the word line WL30 is selected.

At t3, a program voltage Vpgm is applied to the selected word line WL30 connected with the selected memory cell MC1 under the condition that unselected word lines WL0-WL29 and WL31 are set to a pass voltage Vpass. Herein, the program voltage Vpgm may be a voltage higher than a minimum voltage required for causing F-N tunneling of the selected memory cell MC1, for example, about 10V to 20V. At the same time, a voltage of Vcc may be applied to a common source line CSL2 of the selected cell array layer CAL2.

As the program voltage Vpgm is applied to the selected word line WL30, the F-N tunneling may be caused between a gate electrode of the selected memory cell MC1 and its channel, so that the selected memory cell MC1 is programmed. When the selected memory cell MC1 is programmed, a charge may be trapped at an information storing layer of the selected memory cell MC1. This means that a threshold voltage of the selected/programmed memory cell is increased.

Regarding the unselected strings STR of the selected cell array layer CAL2, as described in step S20, channels of the unselected strings may be maintained at a floating state, since the string select transistors SST are shut off. At t3, as a program voltage Vpgm is applied to the selected word line WL30, floated channels may be self boosted. Although the program voltage Vpgm is applied to the selected word line WL30 at t3, a potential difference is not generated between a gate electrode and a channel of a program-inhibited cell MC2 (a memory cell, connected with the WL30, in an unselected string on the selected cell array layer CAL2). Therefore, it is possible to prevent the unselected memory cell MC2 from being programmed.

A program sequence may progress from a memory cell adjacent to the ground select line GSL0 to a memory cell adjacent to the string select line SSL. In this case, there may be a channel voltage of the program-inhibited memory cell MC2 is not boosted up to a desired voltage when a program voltage Vpgm is not applied to the selected word line WL30.

In particular, if memory cells MC between the program-inhibited cell MC2 and the ground select transistor GST are programmed memory cells, channel voltages of the memory cells MC connected with unselected word lines WL0-WL29 and WL31 may be increased in proportion to a voltage difference between a pass voltage Vpass and a channel voltage. That is, channel voltages of memory cells MC between the program-inhibited cell MC2 and the ground select transistor GST may be boosted. At this time, since memory cells MC between the program-inhibited cell MC2 and the ground select transistor GST are programmed, the threshold voltages of the memory cells MC between the program-inhibited cell MC2 and the ground select transistor GST may be higher than a threshold voltage of an erased memory cell. This means that a voltage difference between the pass voltage and a channel voltage is reduced. Since the channel of the program-inhibited cell MC2 shares charge with channels of the memory cells MC connected with unselected word lines WL0-WL29 and WL31, the channel voltage of the program-inhibited cell MC2 may be reduced. That is, the program-inhibited cell MC2 may experience the F-N tunneling due to an increase in a voltage difference between the gate electrode and the channel of the program-inhibited cell MC2. This means that a program disturbance is generated at the program-inhibited cell MC2.

To reduce the program disturbance, a local voltage Vlocal (for example, 0V) lower than a pass voltage Vpass is applied to word lines WL29 and WL31 adjacent to the selected word line WL30 in order to prevent the program-inhibited cell MC2 from being programmed owing to a charge sharing phenomenon of the unselected string STR. This enables a voltage difference between the gate electrode and the channel of the program-inhibited cell MC2 to become lower than a threshold voltage. As a result, the memory cells MC supplied with the local voltage Vlocal may be turned off. Since the memory cells MC supplied with the local voltage Vlocal are turned off, the program-inhibited cell MC2 may be isolated from adjacent memory cells MC. This means that the program voltage Vpgm is limited to the channel of the program-inhibited cell MC2. In other words, as a local voltage is applied to the word lines WL29 and WL31 adjacent to the selected word line WL30, only the channel of the program-inhibited cell MC2 may be self boosted locally. Thus, it is possible to prevent the program-inhibited cell MC2 from being programmed when the program voltage is applied to the selected word line WL30.

For strings STR placed above and/or below the selected string STR, the bit line BL0 is floated when the selected memory cell MC1 is programmed and channels of strings STR above and/or below the selected string STR may be maintained at a boosted state. Thus, it is possible to prevent memory cells MC on the unselected cell array layers CAL0-CAL1 from being programmed.

Figure 11B:
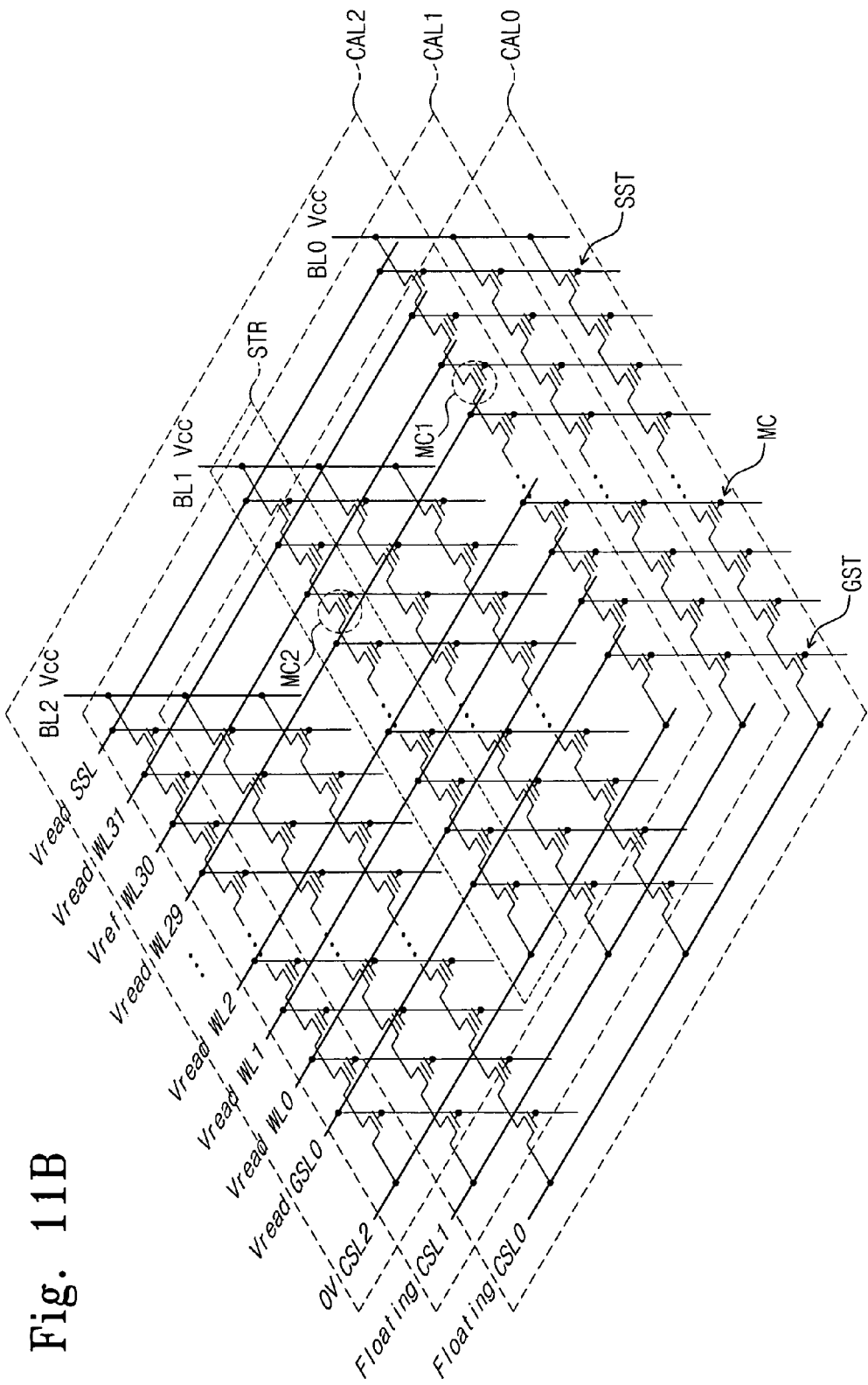

Referring to FIGS. 6, 11A, and 11B, at S40, a program verification operation may be carried out with respect to the selected memory cell MC1.

The program verification operation may be performed to confirm whether the selected memory cell MC1 is programmed to have a minimum threshold voltage. During the program verification operation, the minimum threshold voltage (that is, a verification voltage Vref) may be applied to the selected word line WL30.

In order to perform the program verification operation, the cell array layer CAL2 including the programmed memory cell MC1 is selected. This may be accomplished by applying a voltage of 0V to the common source line CSL2 of the selected cell array layer CAL2 and floating other unselected common source lines CSL0 and CSL1. During the program verification operation, a voltage of Vcc is applied to the bit lines BL0-BL2, and a read voltage Vread is applied to the ground select line GSL0 and the string select line SSL. At the same time, a verification voltage Vref is applied to the word line WL30 connected with the programmed memory cell MC1, and a read voltage Vread is applied to the unselected word lines WL0-WL29 and WL31. Herein, the read voltage Vread may be a voltage enough to turn on the unselected memory cells MC.

With the above-described bias condition, the string select transistors SST, ground select transistors GST, and unselected memory cells MC may be turned on.

In a case where the selected memory cell MC1 is programmed, its threshold voltage may be increased to be higher than the verification voltage Vref. Thus, when the verification voltage Vref is applied to the selected memory cell MC1, the selected memory cell MC1 is not turned on, so that no current flows via the string. This means that a voltage of the bit line BL0 is not discharged.

On the other hand, in the event that the selected memory cell MC1 is not programmed, its threshold voltage may be lower than the verification voltage Vref. Thus, when the verification voltage Vref is applied to the selected memory cell MC1, the selected memory cell MC1 is turned on, so that current flows via the string. This means that a voltage of the bit line BL0 is discharged.

Regarding the unselected cell array layers CAL0 and CAL1, no current may flow via strings under the above-described bias condition, since the common source lines CSL0 and CSL1 are floated.

As illustrated in FIG. 6, at S50, a determination of whether a program operation is completed is made. If the program operation is completed, new data to be programmed in the memory cells MC may be loaded on the page buffer 30 at S60 (refer to FIG. 1), and then the procedure goes to S10. If the program operation is not completed, S60 is not performed and the procedure goes to S10.

Like the program method, a read method of a nonvolatile memory device according to an example embodiment may include selecting one of the cell array layers CAL0-CAL2, selecting a string STR, selecting a memory cell MC to be read, and reading data from the selected memory cell MC. In practice, a read operation is similar with the program verification operation except that a voltage of 0V is applied to a selected word line WL0-WL31 instead of a verification voltage to detect voltage variations of the bit lines BL0-BL2 and read data.

Further, at an erase operation of a nonvolatile memory device according to an example embodiment, it is possible to erase data stored in the memory cells MC by applying an erase voltage to the semiconductor patterns 120 included in the cell array layers CAL0-CAL2.

As above described, it is possible to improve the degree of integration by arranging memory cells as horizontal channels. Further, it is possible to perform a program operation independently with respect to cell array layers using common source lines.

Figure 12:
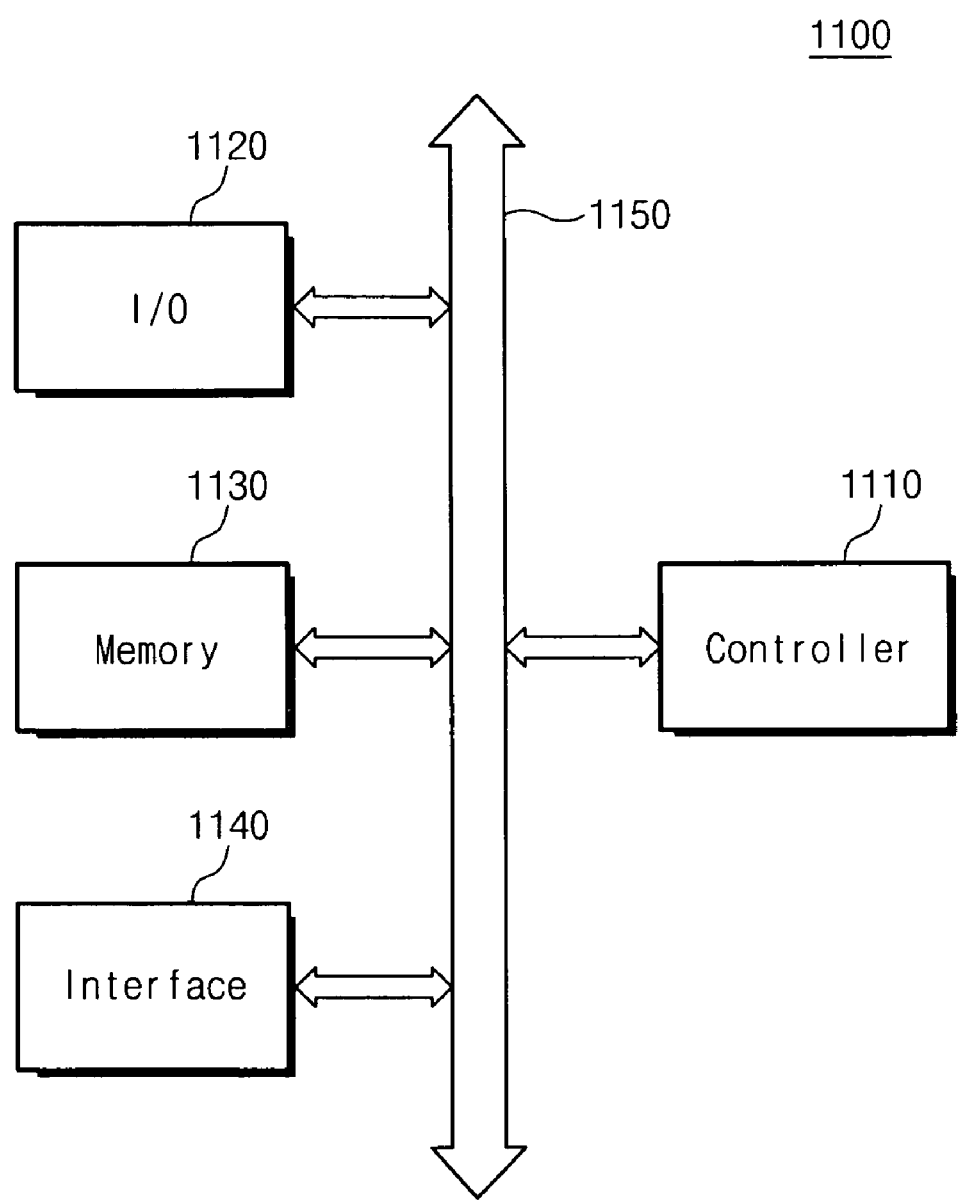
FIG. 12 is a block diagram showing a memory system including a nonvolatile memory device according to an example embodiment.

FIG. 12 is a block diagram showing a memory system including a nonvolatile memory device according to an example embodiment.

Referring to FIG. 12, a memory system 1100 may be applied to PDA, portable computer, web tablet, wireless phone, mobile phone, digital music player, memory card, or devices capable of transmitting and/or receiving information at a wireless circumstance.

The memory system 1100 may include a controller 1110, an input/output device 1120 such as a keyboard and a display, a memory 1130, an interface 1140, and a bus 1150. The memory 1130 and the interface 1140 may communicate with each other via a bus 1150.

The controller 1110 may include at least one microprocessor, a digital signal processor, a microcontroller, or other process devices. The memory 1130 may be used to store commands to be executed by the controller 1110. The input/output device 1120 may receive data or signals from an external device or issue data or signals to the external device. For example, the input/output device 1120 may include a keyboard, a keypad, or a display device.

The memory 1130 may include the nonvolatile memory device shown in FIG. 1 having the memory cell array shown in FIG. 2 or 5. Alternatively, the memory 1130 may include a volatile random access memory, different types of memories, and the like. The interface 1140 may send data to a network or receiving data therefrom.

Figure 13:
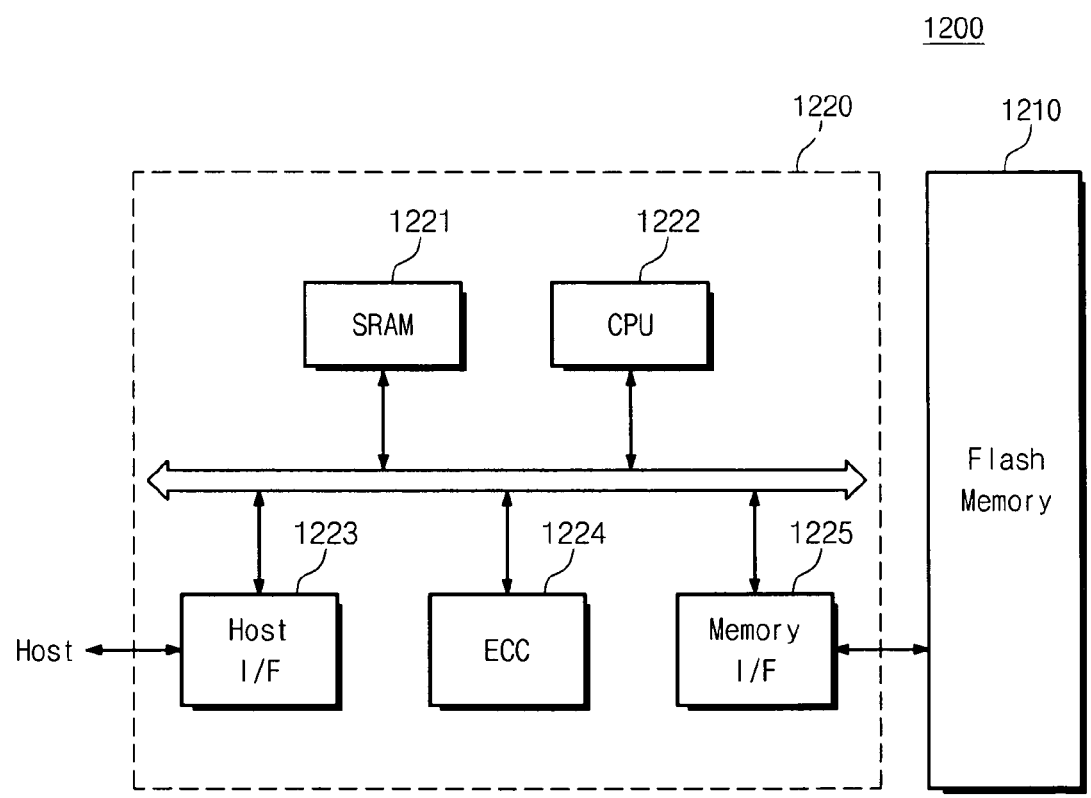
FIG. 13 is a block diagram showing a memory card including a nonvolatile memory device according to an example embodiment.

FIG. 13 is a block diagram showing a memory card including a nonvolatile memory device according to an example embodiment.

Referring to FIG. 13, a memory card 1200 for supporting a large-volume data storage capacity may include a flash memory device 1210. The flash memory device 1210 may be the nonvolatile memory device shown in FIG. 1 having the memory cell array shown in FIG. 2 or 5. The memory card 1200 may include a memory controller 1220 for controlling data exchange between a host and the flash memory device 1210.

SRAM 1221 may be used as an operating memory of a processing unit 1222. A host interface 1223 may include data exchange protocols of a host connected with the memory card 1200. An ECC block 1223 may detect and correct errors included in data read out from the multi-bit flash memory device 1210. The memory interface 1225 may interface with the flash memory device 1210. The processing unit 1222 may perform an overall control operation for data exchange of the memory controller 1220. Although not illustrated in figures, it is well comprehended that the memory card 1200 may further comprise ROM for storing code data for interfacing with the host.

Figure 14:
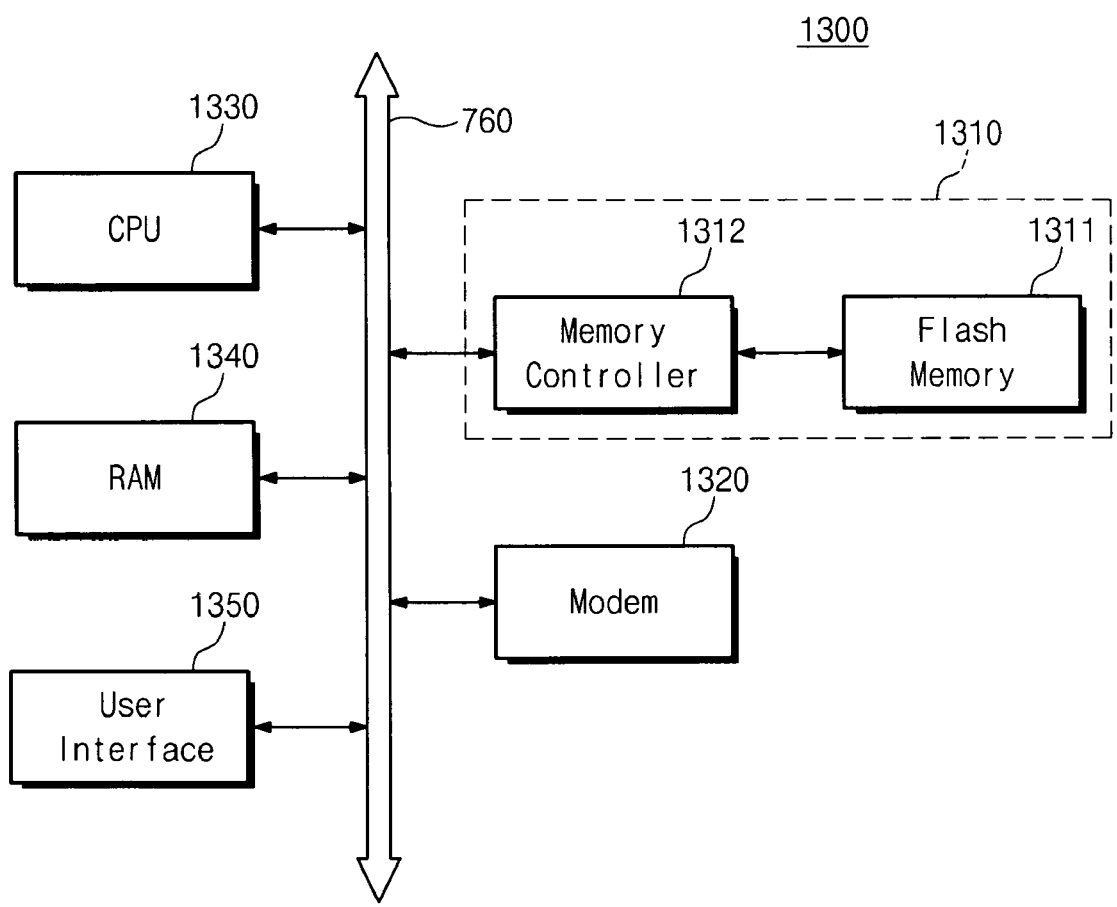
FIG. 14 is a block diagram showing an information processing system including a nonvolatile memory device according to an example embodiment.

FIG. 14 is a block diagram showing an information processing system including a nonvolatile memory device according to an example embodiment.

Referring to FIG. 14, a flash memory system 1310 may include the nonvolatile memory device shown in FIG. 1 having the memory cell array shown in FIG. 2 or 5 and be applied to an information processing system such as a mobile device or a desktop computer. The information processing system 1300 may include the flash memory system 1310, a modem 1320, CPU 1330, RAM 1340, a user interface 1350 which are connected with a system bus 1360. Data processed by the CPU 1330 or received from an external device may be stored in the flash memory system 1310. In the event that the flash memory system 1310 is formed of the SSD, the information processing system 1300 may store mass data in the flash memory system 1310 safely. With an increase in the reliability, the flash memory system 1310 may reduce resources needed for error correction such that a high-speed data exchange function is provided to the information processing system 1300. Although not shown in the figures, it should be understood that the information processing system 1300 may further include an application chipset, camera image processor (CIS), input/output device, and the like.

A flash memory device or a memory system according to example embodiments may be packed by various packages such as PoP (Package on Package), Ball grid arrays(BGAs), Chip scale packages (CSPs), Plastic Leaded Chip Carrier (PLCC), Plastic Dual In-Line Package (PDIP), Die in Waffle Pack, Die in Wafer Form, Chip On Board(COB), Ceramic Dual In-Line Package (CERDIP), Plastic Metric Quad Flat Pack(MQFP), Thin Quad Flatpack(TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A nonvolatile memory device comprising:
   a memory cell array, the memory cell array including,
   a first plurality of cell array layers stacked on a semiconductor substrate, each of the first plurality of cell array layers including,
   a first plurality of strings, each of the first plurality of strings having a first plurality of memory cells connected between first string and first ground select transistors, and
   a common source line connected to first sides of the first plurality of strings, a first plurality of bit lines, each of the first plurality of bit lines connected to a second side of one of the first plurality of strings for each of the first plurality of cell array layers, and a first plurality of word lines connected with the first plurality of memory cells, wherein the common source lines of the first plurality of cell array layers are electrically separated from each other.

2. The nonvolatile memory device of claim 1, wherein each of the first plurality of strings includes, a semiconductor layer pattern which is substantially normal to the first plurality of word lines.

3. The nonvolatile memory device of claim 2, wherein each of the first plurality of bit lines includes, a conductive line in parallel with the semiconductor layer patterns, and a bit line contact plug connected to the second side of one of the first plurality of strings for each of the first plurality of cell array layers via the semiconductor layer patterns.

4. The nonvolatile memory device of claim 3, wherein the bit line contact plugs include a semiconductor material doped with a P-type impurity.

5. The nonvolatile memory device of claim 4, wherein PN junctions are formed between the bit line contact plugs and drain regions of the first string select transistors.

6. The nonvolatile memory device of claim 3, wherein the first string and first ground select transistors are NMOS transistors and the bit line contact plugs are formed of a P-type doped semiconductor material connected with drains of the first string select transistors.

7. The nonvolatile memory device of claim 1, wherein each of the first plurality of cell array layers includes, a connection line connected to the common source line, the connection line being electrically isolated from connection lines of at least another cell array layer of the first plurality of cell array layers.

8. The nonvolatile memory device of claim 1, wherein the memory cell array includes, a second plurality of cell array layers stacked on the semiconductor substrate, the second plurality of cell array layers being coupled to the first plurality of cell array layers by the common source lines.

9. The nonvolatile memory device of claim 8, wherein each of the second plurality of cell array layers includes, a second plurality of strings, each of the second plurality of strings having a second plurality of memory cells connected between second string and ground select transistors, and one of the common source lines, the one of the common source lines being connected to first sides of the second plurality of strings.

10. The nonvolatile memory device of claim 9, wherein the semiconductor substrate includes, a memory cell region, the first and second pluralities of memory cells being on the memory cell region, and a contact region.

11. The nonvolatile memory device of claim 10, wherein the memory cell array includes, an insulation film formed on the contact region, and connection lines on the insulation film, the connection lines connected to the common source lines, respectively.

12. The nonvolatile memory device of claim 8, further comprising:

a row decoder connected to the memory cell array;
a layer decoder connected to the memory cell array;
a page buffer connected to the memory cell array; and
a column decoder connected to the memory cell array.

13. The nonvolatile memory device of claim 1, further comprising:

a row decoder connected to the memory cell array;
a layer decoder connected to the memory cell array;
a page buffer connected to the memory cell array; and
a column decoder connected to the memory cell array.

14. The nonvolatile memory device of claim 1, wherein the first plurality of memory cells are connected in series.

15. A nonvolatile memory device comprising:

a plurality of semiconductor layer patterns vertically stacked on a substrate;

a plurality of word lines crossing sidewalls of the semiconductor layer patterns; and a plurality of common source lines vertically stacked on the substrate, each of the common source lines commonly connected to the semiconductor layer patterns which are disposed at substantially the same vertical distance from the substrate.

16. The nonvolatile memory device of claim 15, further comprising:

bit lines commonly connected to the semiconductor layer patterns which are disposed at different distances from the substrate.

17. The nonvolatile memory device of claim 15, further comprising:

a charge storage layer pattern disposed between the semiconductor layer pattern and the word lines.

18. The nonvolatile memory device of claim 15, wherein the substrate includes a memory cell region and a contact region, and the semiconductor layer patterns, the word lines, and the common source lines are disposed on the memory cell region of the substrate.

19. The nonvolatile memory device of claim 18, further comprising:

a plurality of connection lines having a stepwise stacked structure on the contact region of the substrate and connected to the common source lines, respectively.

20. A nonvolatile memory device comprising:

a plurality of semiconductor layer patterns vertically stacked on a substrate;

a plurality of word lines crossing sidewalls of the semiconductor layer patterns; and a plurality of common source lines vertically stacked on the substrate, each of the common source lines commonly connected to the semiconductor layer patterns which are disposed at substantially the same vertical distance from the substrate, wherein the word lines are disposed substantially normal to the substrate.

* * * * *